(12) United States Patent
Choi

(10) Patent No.: US 11,270,742 B2
(45) Date of Patent: Mar. 8, 2022

(54) MEMORY APPARATUS HAVING STRUCTURE COUPLING PAD AND CIRCUIT

(71) Applicant: SK hynix Inc., Icheon-si (KR)

(72) Inventor: Suk Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/009,519

(22) Filed: Sep. 1, 2020

(65) Prior Publication Data

US 2021/0312956 A1    Oct. 7, 2021

(30) Foreign Application Priority Data

Apr. 6, 2020    (KR) .................. 10-2020-0041373

(51) Int. Cl.
 *G11C 7/10* (2006.01)
 *G01R 31/28* (2006.01)
 *G11C 29/12* (2006.01)
 *G11C 29/18* (2006.01)

(52) U.S. Cl.
 CPC ........ *G11C 7/1048* (2013.01); *G01R 31/2887* (2013.01); *G11C 7/109* (2013.01); *G11C 7/1057* (2013.01); *G11C 7/1063* (2013.01); *G11C 7/1084* (2013.01); *G11C 29/1201* (2013.01); *G11C 2029/1802* (2013.01)

(58) Field of Classification Search
 CPC ........ G11C 29/1201; G11C 2029/1802; G11C 7/1048; G11C 7/1057; G11C 7/1063; G11C 7/1084; G11C 7/109; G01R 31/2887

USPC .................................... 365/189.05, 189.02
See application file for complete search history.

(56) References Cited

U.S. PATENT DOCUMENTS

| | | | |
|---|---|---|---|
| 4,553,090 A | 11/1985 | Hatano et al. | |
| 6,813,738 B2 | 11/2004 | Whetsel, Jr. | |
| 7,269,041 B2* | 9/2007 | Kim ..................... | G11C 7/1075 365/51 |
| 7,499,356 B2* | 3/2009 | Do ......................... | G11C 29/26 365/201 |
| 7,773,439 B2* | 8/2010 | Do ....................... | G11C 7/1012 365/201 |
| 10,365,325 B2* | 7/2019 | Dono .................... | G11C 29/022 |

FOREIGN PATENT DOCUMENTS

KR    100867638 B1    11/2008
KR    101068568 B1    9/2011

* cited by examiner

*Primary Examiner* — Son L Mai
(74) *Attorney, Agent, or Firm* — William Park & Associates Ltd.

(57) ABSTRACT

A memory apparatus includes an internal circuit configured to output a plurality of output signals, a signal conversion circuit configured to convert a control signal to generate a selection signal, and a selection circuit configured to output one of the plurality of output signals based on the selection signal. The memory apparatus also includes a buffer configured to buffer output of the selection circuit and output the buffered output to a pad.

17 Claims, 3 Drawing Sheets

MEMORY APPARATUS HAVING STRUCTURE COUPLING PAD AND CIRCUIT

CROSS-REFERENCES TO RELATED APPLICATION

The present application claims priority under 35 U.S.C. § 119(a) to Korean application number 10-2020-0041373, filed on Apr. 6, 2020, in the Korean Intellectual Property Office, which is incorporated herein by reference in its entirety.

BACKGROUND

1. Technical Field

Various embodiments generally relate to integrated circuit technology, and more particularly, to a memory apparatus in which circuits are disposed below a cell area.

2. Related Art

A memory apparatus includes a memory cell array including a plurality of memory cells in which the memory apparatus may store various data. In order to ensure a larger storage capacity in a memory chip having a limited area, an area occupied by the memory cell array in the memory chip continues to increase. The memory apparatus includes various internal circuits capable of storing data in the memory cell array or outputting the data stored in the memory cell array, and the internal circuits are disposed below the memory cell array to ensure an area of the memory cell array.

The memory chip of the memory apparatus may be fabricated on a wafer. In order to test performance or failure of the memory chip at a wafer level, a probe test may be performed. The probe test may be performed by allowing a probe tip to contact a pad to sense electrical signals outputted from internal circuits coupled to the pad.

SUMMARY

In an embodiment, a memory apparatus may include an internal circuit, a signal conversion circuit, a selection circuit, and a buffer. The internal circuit may be configured to output a plurality of output signals. The signal conversion circuit may be configured to convert a control signal to generate a selection signal. The selection circuit may be configured to output one of the plurality of output signals based on the selection signal. The buffer may be configured to buffer output of the selection circuit and output the buffered output to a pad.

In an embodiment, a memory apparatus may include a memory cell array layer, at least one pad, and a transistor layer. The memory cell array may be formed in the memory cell array layer. The at least one pad may be disposed above the memory cell array layer. The transistor layer may be disposed below the memory cell array layer. The transistor layer may include an internal circuit, a signal conversion circuit, a selection circuit, and a buffer. The internal circuit may be configured to output a plurality of output signals. The signal conversion circuit may be configured to convert a control signal to generate a selection signal. The selection circuit may be configured to output one of the plurality of output signals based on the selection signal. The buffer may be configured to buffer output of the selection circuit and output the buffered output to the at least one pad.

DETAILED DESCRIPTION

Figure 1:
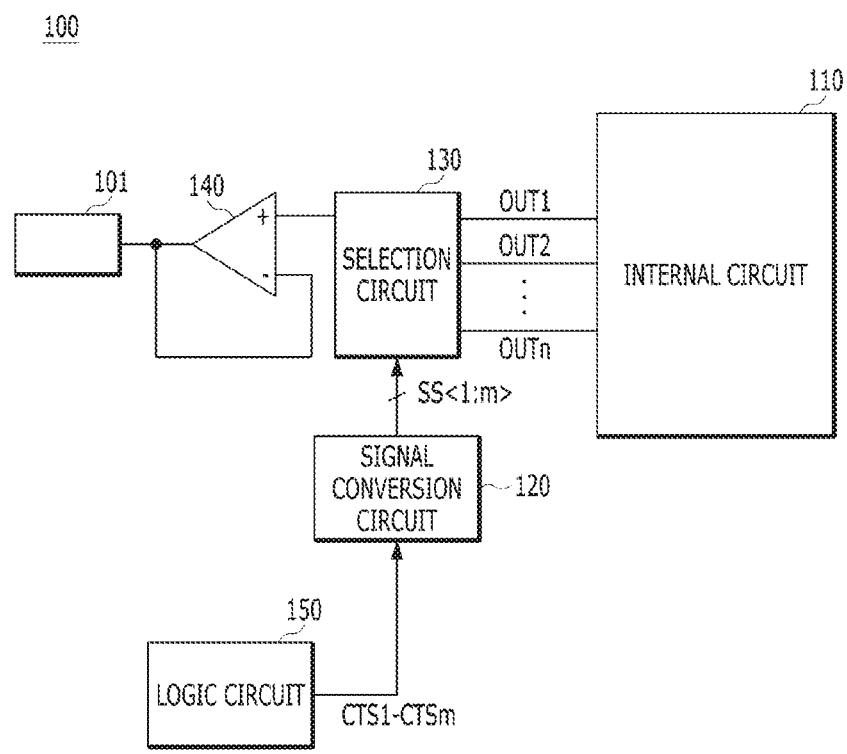
FIG. 1 is a diagram illustrating a configuration of a memory apparatus in accordance with an embodiment.

FIG. 1 is a diagram illustrating a configuration of a memory apparatus 100 in accordance with an embodiment. Referring to FIG. 1, the memory apparatus 100 may include an internal circuit 110 capable of performing various operations and a test circuit for monitoring a plurality of output signals OUT1, OUT2, . . . , and OUTn outputted from the internal circuit 110. The plurality of output signals OUT1, OUT2, . . . , and OUTn may include n output signals and n may be an integer equal to or more than 3. The internal circuit 110 may include any circuit required when the memory apparatus 100 performs various operations. The example of the circuit is not intended to be limited, for example, the internal circuit 110 may include a data input/output circuit in order to write and read data. The internal circuit 110 may include a voltage generation circuit for generating a reference voltage and/or an internal voltage. The memory apparatus 100 may include at least one pad 101. The pad 101 may be a signal path and/or a terminal for outputting a signal generated inside the memory apparatus 100 to the outside of the memory apparatus 100 or receiving a signal transmitted from the outside of the memory apparatus 100. The test circuit may output the plurality of output signals OUT1, OUT2, . . . , and OUTn, which are outputted from the internal circuit 110, through the pad 101. The pad 101 may be a probe pad with which a probe tip may make contact.

The memory apparatus 100 may include a signal conversion circuit 120, a selection circuit 130, and a buffer 140. The signal conversion circuit 120, the selection circuit 130, and the buffer 140 may constitute the test circuit. The signal conversion circuit 120 may receive a plurality of control signals CTS1 to CTSm and generate selection signals. Each of the plurality of control signals CTS1 to CTSm may be a signal having at least one bit. The plurality of control signals CTS1 to CTSm may include m control signals and m may be an integer equal to or more than 2. The plurality of control signals CTS1 to CTSm may be sequentially transmitted in series and the signal conversion circuit 120 may sequentially receive the plurality of control signals CTS1 to CTSm. The signal conversion circuit 120 may receive the plurality of control signals CTS1 to CTSm and generate at least one selection signal SS<1:m> having a plurality of bits. For example, the selection signal SS<1:m> may include m bits. The signal conversion circuit 120 may parallelize the plurality of control signals CTS1 to CTSm sequentially inputted in series and generate the selection signal SS<1:m> having a plurality of bits. The signal conversion circuit 120 may include a parallelizer for converting the plurality of control signals CTS1 to CTSm inputted in series into the at least one selection signal SS<1:m>. In an embodiment, the signal conversion circuit 120 may further include a decoder that decodes the plurality of control signals CTS1 to CTSm and generates the selection signal SS<1:m>. In an embodiment, the number of the plurality of control signals and the number of bits included in the selection signal generated by the signal conversion circuit 120 may be different from each other.

The selection circuit 130 may receive the plurality of output signals OUT1, OUT2, . . . , and OUTn outputted from the internal circuit 110. The plurality of output signals OUT1, OUT2, . . . , and OUTn may be signals outputted from various circuits included in the internal circuit 110. The selection circuit 130 may receive the selection signal SS<1:m> from the signal conversion circuit 120. The selection circuit 130 may output one of the plurality of output signals OUT1, OUT2, . . . , and OUTn based on the selection signal SS<1:m>. The selection circuit 130 may include a multiplexer that selects one of the plurality of output signals OUT1, OUT2, . . . , and OUTn based on the selection signal SS<1:m>.

The buffer 140 may be coupled to the selection circuit 130, and buffer the output of the selection circuit 130 and provide the buffered output to the pad 101. The buffer 140 may include a unit gain buffer. The buffer 140 buffers the output of the selection circuit 130, thereby substantially preventing a signal outputted through the pad 101 from being distorted or transformed. The buffer 140 may maintain the electrical characteristics of the output of the selection circuit 130 to be identical to those of the signal outputted through the pad 101.

The memory apparatus 100 may further include a logic circuit 150. The logic circuit 150 may generate the plurality of control signals CTS1 to CTSm and provide the plurality of control signals CTS1 to CTSm to the signal conversion circuit 120. The logic circuit 150 may include any circuit for controlling the operation of the memory apparatus 100 such that memory apparatus 100 may perform various operations. The logic circuit 150 may generate the plurality of control signals CTS1 to CTSm in order to monitor the operation of the internal circuit 110, and sequentially transmit the plurality of control signals CTS1 to CTSm in series to the signal conversion circuit 120.

The operations of the logic circuit 150, the signal conversion circuit 120, and the selection circuit 130 will be described as follows. For clarify of description, it is assumed that n is 8 and m is 3. Eight output signals OUT1, OUT2, . . . , and OUTn are generated from the internal circuit 110, the selection circuit 130 is implemented as an 8:1 multiplexer, and the selection signal SS<1:m> may include 3 bits. The logic circuit 150 may sequentially transmit three control signals CTS1 to CTSm in series to the signal conversion circuit 120. For example, when the logic circuit 150 sequentially transmits three control signals CTS1 to CTSm each having a logic low level, the signal conversion circuit 120 may parallelize the control signals CTS1 to CTSm and generate the selection signal SS<1:m> having a logic level of 0, 0, and 0. The selection circuit 130 may select and output the first output signal OUT1 of the eight output signals based on the selection signal SS<1:m>. When the logic circuit 150 sequentially transmits three control signals CTS1 to CTSm having a logic low level, a logic low level, and a logic high level, respectively, the signal conversion circuit 120 may parallelize the control signals CTS1 to CTSm and generate the selection signal SS<1:m> having a logic level of 0, 0, and 1. The selection circuit 130 may select and output the second output signal OUT2 of the eight output signals based on the selection signal SS<1:m>. When the logic circuit 150 sequentially transmits three control signals CTS1 to CTSm each having a logic high level, the signal conversion circuit 120 may parallelize the control signals CTS1 to CTSm and generate the selection signal SS<1:m> having a logic level of 1, 1, and 1. The selection circuit 130 may select and output the last output signal OUTn of the eight output signals based on the selection signal SS<1:m>.

Figure 2:
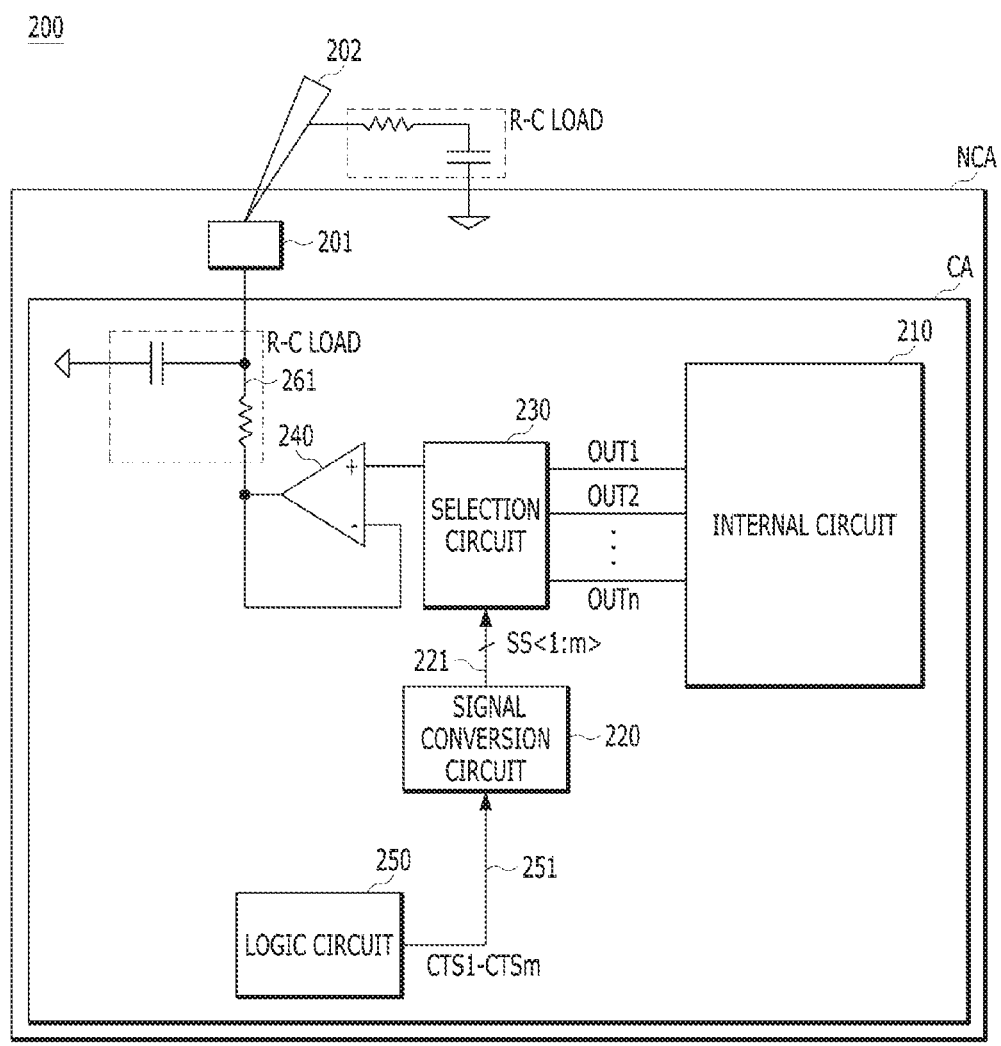
FIG. 2 is a diagram illustrating a configuration of a memory apparatus in accordance with an embodiment.

FIG. 2 is a plan view illustrating a configuration of a memory apparatus 200 in accordance with an embodiment. Referring to FIG. 2, the memory apparatus 200 may include a pad 201, an internal circuit 210, a signal conversion circuit 220, a selection circuit 230, a buffer 240, and a logic circuit 250. The memory apparatus 200 may include substantially the same configuration as that of the memory apparatus 100 illustrated in FIG. 1. Substantially the same components are illustrated with similar reference numerals and a description of substantially the same components will be omitted in order to avoid redundancy. The memory apparatus 200 may include a cell area CA and a non-cell area NCA. The cell area CA is an area where memory cells are formed, and a transistor layer in which transistors are formed may be disposed below the cell area CA. In the transistor layer below the cell area CA, the internal circuit 210, the signal conversion circuit 220, the selection circuit 230, the buffer 240, and the logic circuit 250 may be formed. In the non-cell area NCA, the pad 201 may be disposed. The non-cell area NCA is an area where no memory cells are formed, and may be an area that surrounds the cell area CA outside the cell area CA.

The signal conversion circuit 220 may be disposed closer to the selection circuit 230 than the logic circuit 250. Because the signal conversion circuit 220 receives a plurality of control signals CTS1 to CTSm sequentially transmitted in series from the logic circuit 250, it may be sufficient if one signal transmission line 251 is provided between the logic circuit 250 and the signal conversion circuit 220. Because the signal conversion circuit 220 provides the selection circuit 230 with the selection signal SS<1:m> having a plurality of bits, a plurality of signal transmission lines 221 are provided between the signal conversion circuit 220 and the selection circuit 230. Accordingly, when the signal conversion circuit 220 is disposed adjacent to the selection circuit 230, it is possible to reduce the number of signal transmission lines disposed over the cell area CA and the size of an area where the signal transmission lines are disposed. Accordingly, it is possible to simplify an interconnection of the memory apparatus 200 and ensure an area of the cell area CA.

The pad 201 may be coupled to the selection circuit 230 through a signal transmission line 261. As the length of the signal transmission line 261 increases, parasitic resistance and parasitic capacitance formed between the selection circuit 230 and the pad 201 may increase. Therefore, an R-C load added to an electrical connection between the selection circuit 230 and the pad 201 may increase. A signal outputted through the pad 201 may be monitored by allowing a probe 202 to contact the pad 201. When the probe 202 contacts the pad 201, an R-C load due to the probe 202 may be added to an electrical connection between the selection circuit 230 and the pad 201. Accordingly, the memory apparatus 200 may include the buffer 240, thereby substantially preventing signal distortion or transformation due to an increase in the R-C load. The buffer 240 may buffer the output of the selection circuit 230 and provide the buffered output to the pad 201, thereby allowing signals to have substantially the same electrical characteristics as those of output signals OUT1, OUT2, . . . , and OUTn outputted from the internal circuit 210 to be outputted through the pad 201. Accordingly, in the memory apparatus 200, even though a physical distance from the internal circuit 210 to the pad 201 increases, it is possible to improve the accuracy of a test operation by maintaining the electrical characteristics of a signal monitored through the probe 202 to be substantially identical to those of a signal outputted from the internal circuit 210.

Figure 3:
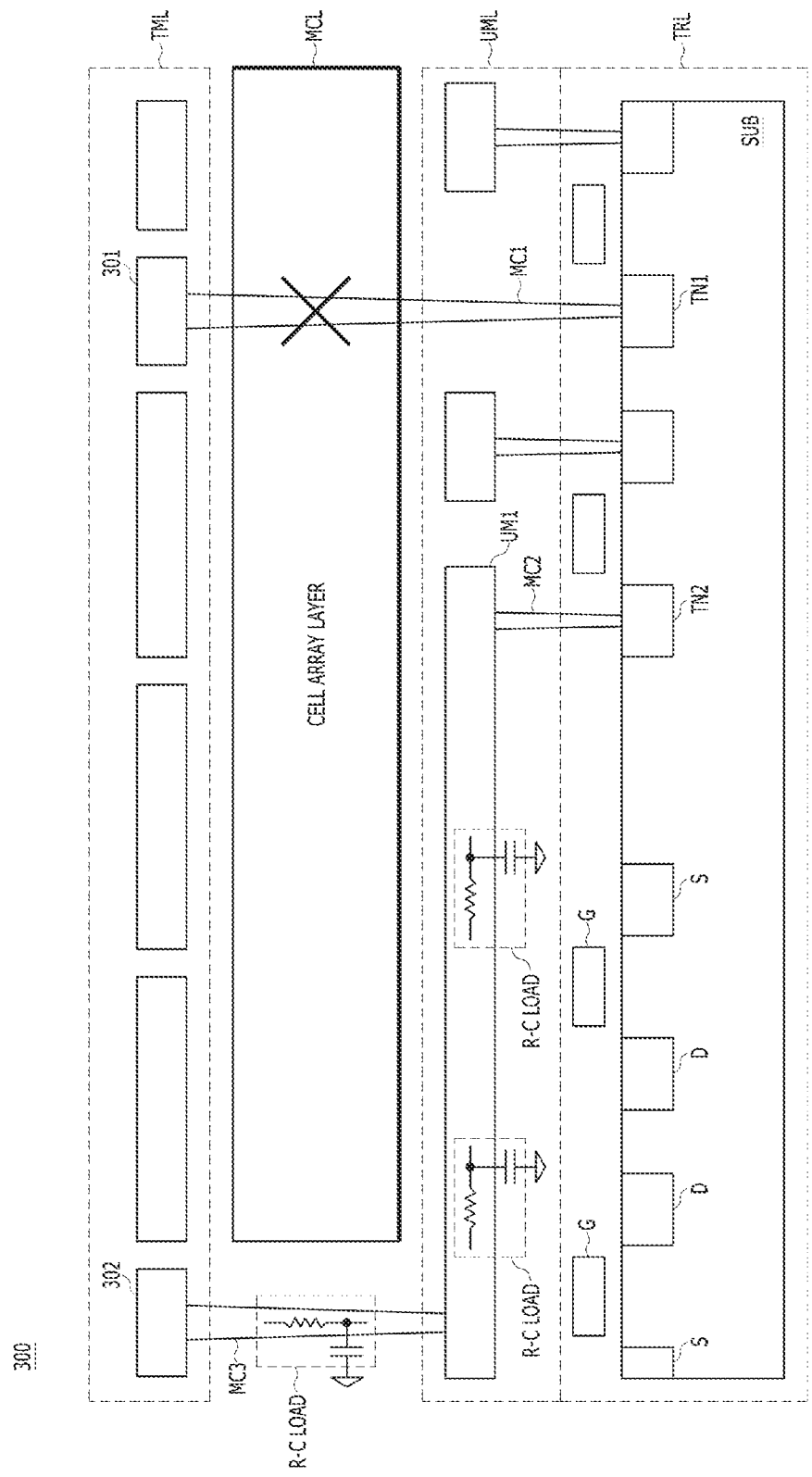
FIG. 3 is a diagram illustrating a configuration of a memory apparatus in accordance with an embodiment.

FIG. 3 is a diagram illustrating a configuration of a memory apparatus 300 in accordance with an embodiment. Referring to FIG. 3, the memory apparatus 300 may include a memory cell array layer MCL and a transistor layer TRL. Although not illustrated in FIG. 3, in the memory cell array layer MCL, a plurality of memory cells for storing data and a plurality of row lines and a plurality of column lines capable of selecting the plurality of memory cells may be disposed. In the transistor layer TRL, a plurality of transistors may be formed. In order to reduce the size of a memory chip, the memory cell array layer MCL may be disposed above the transistor layer TRL, When the transistor layer TRL is disposed below the memory cell array layer MCL, a planar area of the memory chip is reduced, so that it is possible to reduce the size of the memory apparatus 300. A top metal layer TML may be disposed above the memory cell array layer MCL, and an under metal layer UML may be disposed between the memory cell array layer MCL and the transistor layer TRL. The transistor layer TRL includes a substrate SUB, and sources S and drains D of a plurality of transistors may be formed on the substrate SUB. Gates G of the plurality of transistors may be formed above the substrate SUB.

The top metal layer TML includes a plurality of metal lines, and each of the plurality of metal lines may form a signal transmission line. The under metal layer UML includes a plurality of metal lines, and each of the plurality of metal lines may form a signal transmission line. A plurality of pads may be disposed above the memory cell array layer MCL. The plurality of pads may be disposed outside an area where the memory cell array layer MCL is disposed. For example, the plurality of pads may be disposed in the non-cell area NCA, which is located outside the area where the memory cell array layer MCL is disposed, in a plane as illustrated in FIG. 2. The source S and/or the drain D of the transistor may be target nodes to which an output signal is outputted from the internal circuit 110 illustrated in FIG. 1 and FIG. 2. The target nodes may be coupled to the under metal layer UML and/or the top metal layer TML through metal contacts, respectively. For example, when a metal contact MC1 that couples a first target node TN1 and a pad 301 in a vertical direction is formed to couple the first target node TN1 and the pad 301, an electrical connection having the shortest distance may be formed between the first target node TN1 and the pad 301. However, because the memory cell array layer MCL is disposed on the transistor layer TRL, the metal contact MC1 may not be formed through the memory cell array layer MCL, as indicated by the symbol "X." Therefore, in order to form an electrical connection from a target node located in the transistor layer TRL to a pad located in the top metal layer TML, it is necessary to form a signal path that bypasses the memory cell array layer MCL. For example, a method of coupling a second target node TN2 and a pad 302 is as follows. The second target node TN2 may be coupled to a metal line UM1 of the under metal layer UML through a metal contact MC2, and the pad 302 may be coupled to the metal line UM1 through at least one metal contact MC3. By forming the signal path that bypasses the memory cell array layer MCL, the physical distance of a signal transmission line between the second target node TN2 and the pad 302 inevitably increases and parasitic resistance and parasitic capacitance may increase in proportion to the length of the signal transmission line. Therefore, an R-C load added to an electrical connection between the second target node TN2 and the pad 302 may increase. In a case where the R-C load increases, when a signal outputted from the second target node TN2 reaches the pad 302, the electrical characteristics of the signal may be changed and distorted and an operation of an internal circuit may be unstable. Because the memory apparatus 300 includes the components of the memory apparatuses 100 and 200 illustrated in FIG. 1 and FIG. 2, respectively, even though the physical distance of the signal path from the second target node TN2 to the pad 302 increases, the memory apparatus 300 may maintain the electrical characteristics of a signal outputted from the pad 302 to be substantially identical to the electrical characteristics of a signal outputted from the second target node TN2 and the internal circuit can also stably operate regardless of the R-C load. Consequently, the memory apparatus 300 allows an accurate electrical signal to be outputted through the pad, so that it is possible to improve the accuracy of a test for the memory apparatus 300.

Because a person skilled in the art to which the present disclosure pertains may carry out the present disclosure in other specific forms without changing its technical spirit or essential features, it should be understood that the embodiments described above are illustrative in all respects and not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:

1. A memory apparatus comprising:
   an internal circuit configured to output a plurality of output signals;
   a signal conversion circuit configured to receive a plurality of control signals sequentially transmitted in series and generate a selection signal having a plurality of bits;
   a selection circuit configured to output one of the plurality of output signals based on the selection signal; and
   a buffer configured to buffer output of the selection circuit and output the buffered output to a pad.

2. The memory apparatus according to claim 1, further comprising:
   a logic circuit configured to provide the control signal to the signal conversion circuit.

3. The memory apparatus according to claim 2, wherein the signal conversion circuit is disposed closer to the selection circuit than the logic circuit.

4. The memory apparatus according to claim 1, wherein the pad is disposed in a non-cell area located outside an area where the internal circuit, the signal conversion circuit, the selection circuit, and the buffer are disposed.

5. The memory apparatus according to claim 1, wherein the pad comprises a probe pad with which a probe tip is contactable.

6. A memory apparatus comprising:
   a memory cell array layer in which a memory cell array is formed;
   at least one pad disposed above the memory cell array layer; and
   a transistor layer disposed below the memory cell array layer, wherein the transistor layer comprises:

an internal circuit configured to output a plurality of output signals;
a signal conversion circuit configured to convert a control signal to generate a selection signal;
a selection circuit configured to output one of the plurality of output signals based on the selection signal; and
a buffer configured to buffer output of the selection circuit and output the buffered output to the at least one pad.

7. The memory apparatus according to claim 6, further comprising:
a signal transmission line configured to bypass the memory cell array layer and couple the buffer to the at least one pad.

8. The memory apparatus according to claim 6, further comprising:
a logic circuit configured to provide the control signal to the signal conversion circuit.

9. The memory apparatus according to claim 8, wherein the signal conversion circuit is disposed closer to the selection circuit than the logic circuit.

10. The memory apparatus according to claim 6, wherein the signal conversion circuit is configured to receive a plurality of control signals sequentially transmitted in series and generate the selection signal having a plurality of bits.

11. The memory apparatus according to claim 6, wherein the at least one pad is disposed in a non-cell area located outside the memory cell array layer.

12. The memory apparatus according to claim 6, wherein the at least one pad comprises a probe pad with which a probe tip is contactable.

13. A memory apparatus comprising:
an internal circuit configured to output a plurality of output signals;
a signal conversion circuit configured to convert a control signal to generate a selection signal;
a selection circuit configured to output one of the plurality of output signals based on the selection signal; and
a buffer configured to buffer output of the selection circuit and output the buffered output to a pad,
wherein the pad is disposed in a non-cell area located outside an area which the internal circuit, the signal conversion circuit, the selection circuit, and the buffer are disposed.

14. The memory apparatus according to claim 13, further comprising:
a logic circuit configured to provide the control signal to the signal conversion circuit.

15. The memory apparatus according to claim 14, wherein the signal conversion circuit is disposed closer to the selection circuit than the logic circuit.

16. The memory apparatus according to claim 13, wherein the signal conversion circuit is configured to receive a plurality of control signals sequentially transmitted in series and generate the selection signal having a plurality of bits.

17. The memory apparatus according to claim 13, wherein the pad comprises a probe pad with which a probe tip is contactable.

* * * * *